United States Patent
Satou et al.

(10) Patent No.: US 10,008,719 B2
(45) Date of Patent: Jun. 26, 2018

(54) POSITIVE ELECTRODE MATERIAL, POSITIVE ELECTRODE FOR NONAQUEOUS-ELECTROLYTE SECONDARY BATTERY, AND NONAQUEOUS-ELECTROLYTE SECONDARY BATTERY

(71) Applicant: DENSO CORPORATION, Kariya, Aichi-pref. (JP)

(72) Inventors: Yoshinori Satou, Kariya (JP); Shigeki Komine, Kariya (JP); Nobuo Yamamoto, Kariya (JP); Yuta Shimonishi, Kariya (JP); Yuki Tachibana, Kariya (JP)

(73) Assignee: DENSO CORPORATION, Kariya (JP)

( * ) Notice: Subject to any disclaimer, the term of this patent is extended or adjusted under 35 U.S.C. 154(b) by 79 days.

(21) Appl. No.: 15/124,142

(22) PCT Filed: Mar. 20, 2015

(86) PCT No.: PCT/JP2015/001562
§ 371 (c)(1),
(2) Date: Sep. 7, 2016

(87) PCT Pub. No.: WO2015/146098
PCT Pub. Date: Oct. 1, 2015

(65) Prior Publication Data
US 2017/0018771 A1    Jan. 19, 2017

(30) Foreign Application Priority Data

Mar. 26, 2014 (JP) ................. 2014-063722
Feb. 18, 2015 (JP) ................. 2015-029693

(51) Int. Cl.
*H01B 1/08* (2006.01)
*H01M 4/525* (2010.01)
(Continued)

(52) U.S. Cl.
CPC ............ *H01M 4/525* (2013.01); *C30B 29/32* (2013.01); *C30B 29/68* (2013.01); *H01B 1/08* (2013.01);
(Continued)

(58) Field of Classification Search
CPC .... C30B 29/32; C30B 29/68; H01M 10/0525; H01M 2004/028; H01M 4/0404;
(Continued)

(56) References Cited

U.S. PATENT DOCUMENTS 8,794,994 B2   8/2014 Kollmann et al.
2001/0024753 A1   9/2001 Munakata et al.
(Continued)

FOREIGN PATENT DOCUMENTS

JP   2006-202702 A   8/2006
JP   2007-188703 A   7/2007

OTHER PUBLICATIONS

Vellaisamay, M. et al. "Li2Ni0.5Mn0.5SnO4/C: A Novel Hybrid Composite Electrode for High Rate Applications," Inorg. Chem. 2015, 54, 8590-8597 (Year: 2015).*
(Continued)

*Primary Examiner* — Mark Kopec
*Assistant Examiner* — Jaison P Thomas
(74) *Attorney, Agent, or Firm* — Oliff PLC (57) ABSTRACT

A positive electrode material includes $Li_2Ni_\alpha M^1_\eta M^2_\beta O_{4-\gamma}$, where $0<(\alpha+\eta)\leq 2$; $0\leq\eta<0.5$; $0<\beta\leq 2$; $0\leq\gamma\leq 1$; $1\leq(\alpha+\eta+\beta)\leq 2.1$; $0.8<\beta/(\alpha+\eta)$; $M^1$ is Mn; $M^2$ is at least one selected from Ge and Sn; and Ni and $M^1$ has a local structure of six-coordination. The positive electrode material is used for a positive electrode for nonaqueous-electrolyte secondary battery and a nonaqueous-electrolyte secondary battery.

7 Claims, 4 Drawing Sheets

(51) Int. Cl.

| | |
|---|---|
| *H01M 4/485* | (2010.01) |
| *C30B 29/32* | (2006.01) |
| *C30B 29/68* | (2006.01) |
| *H01M 4/131* | (2010.01) |
| *H01M 4/505* | (2010.01) |
| *H01M 4/62* | (2006.01) |
| *H01M 4/66* | (2006.01) |
| *H01M 10/0525* | (2010.01) |
| *H01M 4/04* | (2006.01) |
| *H01M 4/1391* | (2010.01) |
| *H01M 4/02* | (2006.01) |

(52) U.S. Cl.
CPC ........... *H01M 4/131* (2013.01); *H01M 4/485* (2013.01); *H01M 4/505* (2013.01); *H01M 4/623* (2013.01); *H01M 4/625* (2013.01); *H01M 4/661* (2013.01); *H01M 10/0525* (2013.01); *H01M 4/0404* (2013.01); *H01M 4/1391* (2013.01); *H01M 2004/028* (2013.01)

(58) Field of Classification Search
CPC .... H01M 4/131; H01M 4/1391; H01M 4/485; H01M 4/505; H01M 4/525; H01M 4/623; H01M 4/625; H01M 4/661; H01B 1/08
See application file for complete search history.

(56) References Cited

U.S. PATENT DOCUMENTS

| | | | |
|---|---|---|---|
| 2002/0012842 | A1 | 1/2002 | Tsujimoto et al. |
| 2002/0076612 | A1* | 6/2002 | Tanizaki ............... H01M 4/131 |
| | | | 429/223 |
| 2003/0013017 | A1 | 1/2003 | Nagayama et al. |
| 2005/0112466 | A1 | 5/2005 | Jordy et al. |
| 2005/0191551 | A1 | 9/2005 | Tsujimoto et al. |
| 2006/0048157 | A1 | 3/2006 | Dawson et al. |
| 2006/0099508 | A1 | 5/2006 | Thackeray et al. |
| 2008/0116418 | A1 | 5/2008 | Tabuchi et al. |
| 2010/0104943 | A1 | 4/2010 | Thomas et al. |
| 2012/0292562 | A1 | 11/2012 | Kajiya et al. |
| 2014/0030569 | A1 | 1/2014 | Kwon et al. |
| 2016/0294003 | A1* | 10/2016 | Yamamoto ........ H01M 10/0562 |
| 2017/0062816 | A1* | 3/2017 | Son ...................... H01M 4/485 |

OTHER PUBLICATIONS

Seung-Taek Myung et al. "Synthesis of $LiNi_{0.5}Mn_{0.5-x}Ti_xO_2$ by an Emulsion Drying Method and Effect of Ti on Structure and Electrochemical Properties". Chemistry of Materials, 2005, vol. 17, No. 9, pp. 2427-2435.

R. Dominko. "$Li_2MSiO_4$ (M=Fe and/or Mn) Cathode Materials". Journal of Power Sources, 2008, vol. 184, pp. 462-468.

Jun. 9, 2015 International Search Report issued in International Patent Application No. PCT/JP2015/001562.

* cited by examiner

POSITIVE ELECTRODE MATERIAL, POSITIVE ELECTRODE FOR NONAQUEOUS-ELECTROLYTE SECONDARY BATTERY, AND NONAQUEOUS-ELECTROLYTE SECONDARY BATTERY

CROSS REFERENCE TO RELATED APPLICATIONS

This application is based on Japanese Patent Applications No. 2014-63722 filed on Mar. 26, 2014, and No. 2015-29693 filed on Feb. 18, 2015, the disclosures of which are incorporated herein by reference.

TECHNICAL FIELD

The present disclosure relates to a positive electrode material, a positive electrode for nonaqueous-electrolyte secondary battery and a nonaqueous-electrolyte secondary battery formed by using the same.

BACKGROUND ART

As electronic devices such as notebook computers, mobile phones and digital cameras have widely spread, the demand for secondary batteries for driving these electronic devices has increased. Recently, in these electronic devices, the power consumption increases in association with more advanced functions and miniaturization is expected, and thus improvement in performance of secondary batteries is demanded. Among secondary batteries, a nonaqueous-electrolyte secondary battery (particularly, lithium ion secondary battery), which can be designed to have a higher capacity, is actively applied to various electronic devices.

A nonaqueous-electrolyte secondary battery generally has such a configuration that a positive electrode in which a positive electrode active material layer having a positive electrode material represented by a positive electrode active material is formed on the surface of a positive electrode collector, and a negative electrode in which a negative electrode active material layer having a negative electrode material is formed on the surface of a negative electrode collector are connected via a nonaqueous-electrolyte (nonaqueous electrolytic liquid), and accommodated in a battery casing.

In a lithium ion secondary battery, which is a representative example of a nonaqueous-electrolyte secondary battery, a complex oxide of lithium is used as a positive electrode material (positive electrode active material). The complex oxide is described, for example, in Patent Literatures 1 to 6.

Patent Literature 1 describes employing a positive electrode active material formed by mixing $Li_xCoMO_2$ and $LiNiMnMO_2$ (M: selected from predetermined elements). The positive electrode active material has an active material showing high average voltage at the time of discharging, and an active material having high thermal stability.

Patent Literature 2 describes employing a positive electrode active material containing a crystal structure of a layered rocksalt-type structure of $LiNiMnTiO_2$. The positive electrode active material, which contains Ti, can afford a higher charge and discharge capacity in comparison with the case not containing Ti.

Patent Literature 3 describes employing a positive electrode active material formed by mixing $LixMnMO_4$ and $LiNiMO_2$ (M: selected from predetermined elements in both cases). The positive electrode active material achieves excellent battery performance after storage at high temperature.

Patent Literature 4 describes a positive electrode active material in which part of Li in $LiMnMO_2$ having a layered polycrystalline structure (M: selected from predetermined elements in both cases) is defined. In the positive electrode active material, distortion in crystals and chemical bonds are stabilized, and the effects such as cycle stability at the time of charging and discharging, and durable stability are achieved.

Patent Literature 5 describes a positive electrode active material in which each of part of Li and Co in $LiCoO_2$ is substituted by a predetermined element M (M: selected from predetermined elements in both cases). In the positive electrode active material, by substituting each of Li and Co by an element M, the binding force between the lithium layer and the cobalt layer is enhanced and distortion between these layers and expansion of crystal lattice are controlled, resulting that the effects such as cycle stability at the time of charging and discharging, and durable stability are obtained.

Patent Literature 6 describes employing a positive electrode active material in which $LiNiMnCoO_2$ and $Li_2MO_3$ are mixed (M: selected from predetermined elements). The positive electrode active material has an active material that exerts excellent effects in terms of battery capacity and safety, and an active material that exerts effects in terms of cycle characteristics and storage characteristics.

However, in any of these positive electrode active materials (positive electrode materials), collapse of the crystal structure at the time of charging and discharging cannot be sufficiently controlled. This disadvantageously leads deterioration in the capacity of the nonaqueous-electrolyte secondary battery. Also regarding the safety, the technique of employing a positive electrode containing Ti, namely a positive electrode formed of $LiNiMnTiO_2$ is described in Non-Patent Literature 1. However, as described in Non-Patent Literature 1, it is described that addition of Ti does not result in overwhelming improvement in safety.

As another attempt to achieve both the safety and the high stability of crystals, a technique of employing a positive electrode containing Si having strong binding force with oxygen in the same amount with transition metal, namely a positive electrode formed of $Li_2MnSiO_4$ is described in Non-Patent Literature 2. However, in this positive electrode, since the transition metal assumes a four-coordination structure, the structure is destabilized at the time of charging, and the positive electrode does not have sufficient durability.

Further, Patent Literature 7 describes an electrochemical active material that is obtained by substituting part of nickel in a single-phase complex oxide of nickel and lithium in the form of $LiNiO_2$. Specifically, a single-phase oxide satisfying $Li(M^1_{(1-a-b-c)}Li_aM^2_bM^3_c)O_2 (0.02<a\leq0.25, 0\leq b<0.30, 0\leq c<0.30, (a+b+c)<0.50, M^3$: at least one element selected from Al, B, and Ga, $M^2$: at least one element selected from Mg and Zn, $M^1=Ni_{(1-x-y-z)}Co_xMn_yM^4_z$, $M^4$: at least one element selected from Fe, Cu, Ti, Zr, V, Ga, and Si, $0\leq x<0.70, 0.10\leq y<0.55, 0\leq z<0.30, 0.20<(1-x-y-z), b+c+z>0)$ is described.

Patent Literature 8 describes a Li oxide satisfying $xLiMO_2\cdot(1-x)Li_2M'O_3$ ($0<x<1$, M: three or more ions including Mn, Co, and Ni, Mn:Ni=1:1, Mn:Co=1:1, M':Mn) and a battery.

Patent Literature 9 describes a thin-film battery employing Li—V oxide represented by $Li_xV_2O_y$ ($0<x\leq100, 0<y\leq5$) is described. As a positive electrode active material of this battery, $LiCoO_2$, $LiNiO_2$, $LiMn_2O_4$, $Li_xMn_{2-y}O_4$ ($1.2<x<2.2$, $y=0.3$), $LiFePO_4$, $LiVOPO_4$, $LiTiS_2$, $LiMn-CrO_4$, $LiCo_{1-x}Al_xO_2$ ($0\leq x\leq 1$), $V_2O_5$, $V_6O_{13}$, $VO_2$, $MnO_2$, $FePO_4$, $VOPO_4$, $TiS_2$, or $MnO_{0.5}Cr_{0.5}O_2$ is described.

PRIOR ART LITERATURES

Patent Literatures

Patent Literature 1: JP-2007-188703-A
Patent Literature 2: JP-2008-127233-A
Patent Literature 3: JP-2001-345101-A
Patent Literature 4: JP-2001-250551-A
Patent Literature 5: JP-3782058-B
Patent Literature 6: JP-2006-202702-A
Patent Literature 7: JP-2005-150093-A
Patent Literature 8: US 2006/99508
Patent Literature 9: US 2006/48157

Patent Literature

Non Patent Literature 1: "Synthesis of $LiNi_{0.5}Mn_{0.5}$-$xTiO_2$ by an Emulsion Drying Method and Effect of Ti on Structure and Electrochemical Properties," Seung-Taek Myung and five others, Chemistry of Materials, 2005, Volume 17, pp 2427-2435
Non Patent Literature 2: "Li2MSiO4 (M=Fe and/r Mn) cathode materials," R. Dominko, Journal of Power Sources, 2008, Volume 184, pp 462-468

SUMMARY OF INVENTION

It is an object of the present disclosure to provide a positive electrode material, a positive electrode for nonaqueous-electrolyte secondary battery and a nonaqueous-electrolyte secondary battery in which collapse of the crystal structure at the time of charging and discharging is controlled, and excellent stability is achieved.

Means for Achieving Object

In order to solve the aforementioned problem, the present discloser focused on the configuration of a positive electrode material, and found that the aforementioned problems can be solved by employing a positive electrode material having a six-coordination structure as a local structure of transition metal and containing a large amount of elements that strongly bind with oxygen.

According to an aspect of the present disclosure, a positive electrode material includes: $Li_2Ni_\alpha M^1_\eta M^2_\beta O_{4-\gamma}$. $0<(\alpha+\eta)\leq 2$; $0\leq\eta<0.5$; $0<\beta\leq 2$; $0\leq\gamma\leq 1$; $1\leq(\alpha+\eta+\beta)\leq 2.1$; $0.8<\beta/(\alpha+\eta)$; $M^1$ is Mn; $M^2$ is at least one selected from Ge and Sn; and Ni and $M^1$ has a local structure of six-coordination.

In the positive electrode material, since Ni and $M^1$ elements (transition metal) has a local structure of six-coordination, and a large amount of $M^2$ element is contained, the crystal structure is further stabilized, and collapse of the crystal structure at the time of charging and discharging is controlled, with the result that reduction in the battery capacity is controlled. In addition, the positive electrode material contains in its composition Ni and $M^1$ element (Mn). These Ni and $M^1$ element form a local structure in which six oxygens (O) are coordinated (local structure of six-coordination). As a result, stable charging and discharging are conducted. It is preferred that Ni, which is a principal oxidation-reduction species, is contained in the range of $0.50<\alpha\leq 1.33$, and by containing a large amount of Ni within the above range, a higher capacity is achieved.

By containing a large amount of $M^2$ element, the crystal structure is further stabilized, and collapse of the crystal structure at the time of charging and discharging is controlled, resulting that reduction in the battery capacity is controlled. A $M^2$ element strongly fixes oxygen. As a result, elimination of oxygen that would otherwise occur at the time of abnormal heat generation is controlled, and the stability of the battery is further improved.

According to another aspect of the present disclosure, a positive electrode (14) for nonaqueous-electrolyte secondary battery is formed by using the positive electrode material. According to another aspect of the present disclosure, a nonaqueous-electrolyte secondary battery is formed by using the positive electrode for nonaqueous-electrolyte secondary battery.

As a result, the positive electrode for nonaqueous-electrolyte secondary battery and the nonaqueous-electrolyte secondary battery can exert the effect obtained by the positive electrode material.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinafter, the present disclosure will be described specifically by way of one embodiment.

Embodiments

Figure 1:
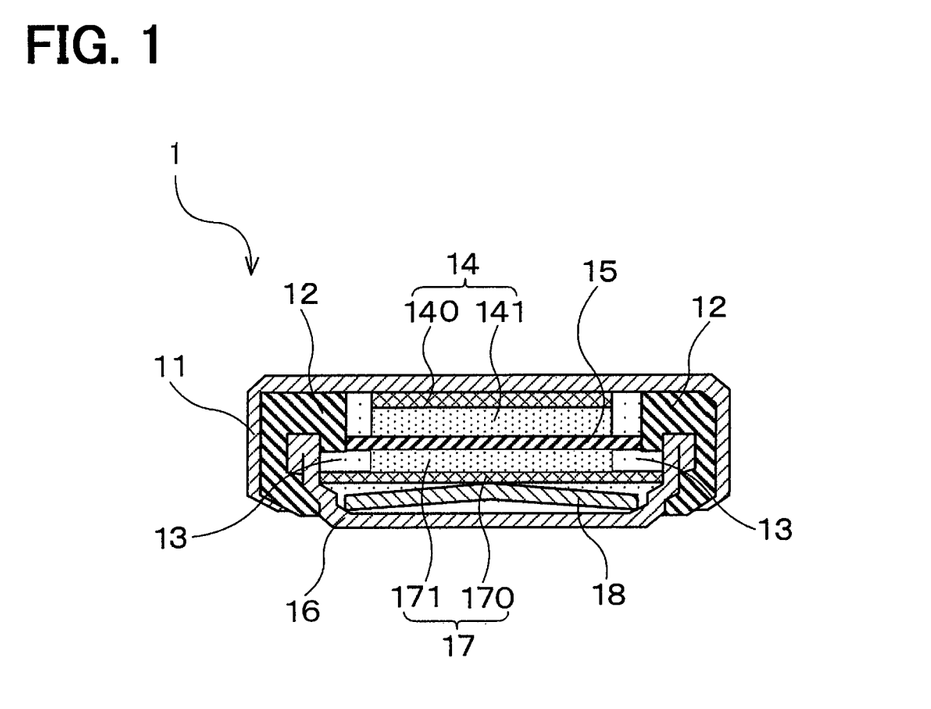
FIG. 1 is a schematic section view showing a configuration of a coin-shaped lithium ion secondary battery according to one embodiment of the present disclosure.

One embodiment of the present disclosure is a coin-shaped lithium ion secondary battery 1 having a configuration shown in a schematic section view of FIG. 1. The lithium ion secondary battery 1 of the present embodiment is a secondary battery (nonaqueous-electrolyte secondary battery) formed by using a positive electrode (positive electrode for nonaqueous-electrolyte secondary battery) having a positive electrode material of the present disclosure as a positive electrode active material.

The lithium ion secondary battery 1 of the present embodiment has a positive electrode casing 11, a sealing material 12 (gasket), a nonaqueous-electrolyte 13, a positive electrode 14, a positive electrode collector 140, a positive electrode mixture layer 141, a separator 15, a negative electrode casing 16, a negative electrode 17, a negative electrode collector 170, a negative electrode mixture layer 171, a retaining member 18 and so on.

The positive electrode 14 of the lithium ion secondary battery 1 of the present embodiment has the positive electrode mixture layer 141 containing a positive electrode active material formed of the positive electrode material of the present disclosure. The positive electrode mixture layer 141 has a binder, a conductive material and the like members as necessary besides the positive electrode active material.

(Positive Electrode Material)

In the positive electrode material, Ni and $M^1$ element (Mn) has a local structure of six-coordination, and is represented by $Li_2Ni_\alpha M^1{}_\eta M^2{}_\beta O_{4-\gamma}$ ($0<\alpha+\eta\leq 2$, $0\leq\eta\leq 0.5$, $0<\beta\leq 2$, $0\leq\gamma\leq 1$, $\alpha+\eta+\beta=1$ to $2.1$, $0.8<\beta/(\alpha+\eta)$, M1: Mn, M2: at least one selected from Ge and Sn).

The positive electrode material of the present embodiment contains Ni (transition metal) in its composition. The Ni forms a local structure in which six oxygens (O) are coordinated (local structure of six-coordination). Also by containing Ni (transition metal), charging and discharging are conducted stably. Also by containing Ni which is an oxidation-reduction species in a large amount within the range of $0.50<\alpha\leq 1.33$, a higher capacity is achieved. In other words, preferably, $0.50<\alpha\leq 1.33$ is satisfied in the above composition.

By containing a large amount of $M^2$ element, the crystal structure is further stabilized, and collapse of the crystal structure at the time of charging and discharging is controlled. As a result, reduction in the battery capacity is controlled. $M^2$ element strongly fixes oxygen. As a result, elimination of oxygen that would otherwise occur at the time of abnormal heat generation is controlled, and thus the stability of the battery is further improved.

It is preferred that $M^2$ element is also in a six-coordination state. This configuration makes it possible to reduce the structural gap with the neighboring transition metal element (coordination structure of Ni or Mn), and to further improve the durability.

The positive electrode material of the present embodiment may further contain in its composition Mn (M1 element, ratio of more than 0 and not more than 0.5) which is transition metal. Likewise Ni, the Mn (M1 element) forms a local structure in which six oxygens (O) are coordinated (local structure of six-coordination). By containing in this ratio, the effect of stabilizing the Ni layer is exerted.

It is considered that repeated charging and discharging is accompanied by change in the local structure near transition metal, which results in deterioration in the positive electrode material. In other words, by controlling the change in the local structure near transition metal, deterioration in the positive electrode material is controlled, and the battery performance is maintained even after repeated charging and discharging.

In the positive electrode material of the present disclosure, by employing the atomic ratio between Ni and $M^1$ element, and $M^2$ element ($0.8<\beta/(\alpha\cdot+\eta)$), $M^2$ element that is small in change in the local structure and excellent in the binding force with oxygen exists every other ones with respect to Ni and M1 elements (transition metal), and deterioration in the positive electrode material can be sufficiently controlled. Further, the positive electrode material of the present disclosure can improve the safety of the nonaqueous-electrolyte secondary battery.

Further, $M^2$ element in a six-coordination state makes it possible to reduce the structural gap with the neighboring transition metal element, and to further improve the durability.

In a nonaqueous-electrolyte secondary battery (lithium ion battery), faults such as ignition and smoking can occur as the overcharge or the like advances. The ignition and smoking in the battery is largely influenced by oxygen released from the positive electrode active material (positive electrode material) during the process reaching that situation. Specifically, when electrons are taken away from oxygen in the positive electrode active material and holes are formed in association with charging, oxygen release is likely to occur. In the positive electrode material of the present disclosure, $M^2$ element is added, and the added $M^2$ element binds with oxygen more strongly than Ni and $M^1$ element (transition metal). In other words, by adding $M^2$ element, it becomes possible to control formation of holes that destabilize oxygen at the time of charging and discharging as small as possible.

Besides this, by employing the atomic ratio between Ni and $M^1$ element, and $M^2$ element ($0.8<\beta/(\alpha+\eta)$), $M^2$ element exists every other ones with respect to Ni and $M^1$ elements (transition metal), and the state in which every oxygen is bound with $M^2$ element is realized, and high safety is ensured. The positive electrode material may be a compound having the aforementioned composition, and is preferably $Li_2NiGeO_4$, $Li_2NiSnO_4$.

The positive electrode material of the present embodiment forms a local structure in which Ni is in a six-coordination state. The local structure can be analyzed by EXAFS (extended X-ray absorption fine structure) that measures the X-ray absorption on a slightly higher energy side of the vicinity of the absorption edge in the measurement result.

Specifically, for the X-ray absorption measurement result of K-edge of Ni, analysis is conducted by determining a radial distribution function obtained by Fourier transformation in the region of $3<k\leq 12$ corresponding to the EXAFS region. In this analysis result, the average distance to the peak position corresponding to the primary proximity from the Ni center indicates the binding between Ni and O in the local structure. When the average distance is 2.00 to 2.20 Å, Ni has a six-coordination local structure.

That is, in the positive electrode material of the present embodiment, it is preferred that the average distance to the peak position corresponding to the primary proximity from the Ni center is 2.00 to 2.20 Å in the analysis result of the radial distribution function obtained by Fourier transformation in the region of $3<k\leq 12$ corresponding to the EXAFS region for the X-ray absorption measurement result of K-edge of Ni.

In the positive electrode material of the present embodiment, likewise Ni, $M^2$ element (Ge or Sn) also forms a local structure of six-coordination. The local structure of $M^2$ element can also be analyzed by EXAFS (extended X-ray absorption fine structure) as is the case with Ni.

That is, in the positive electrode material of the present embodiment, it is preferred that the average distance to the peak position corresponding to the primary proximity from the Ge or Sn center can be described by six-coordination in the analysis result of a radial distribution function obtained by Fourier transformation in the region of $3<k\leq 12$ corresponding to the EXAFS region for the X-ray absorption measurement result of K-edge of Ge or Sn.

It is only required that the positive electrode active material has the aforementioned positive electrode material as a positive electrode active material, and it may have another positive electrode active material (positive electrode material). Another positive electrode active material may be other substance included in the above chemical formula, or may be a still another compound.

(Configuration Other than Positive Electrode Active Material)

The lithium ion secondary battery 1 of the present embodiment can be configured in the same manner as conventional lithium ion secondary batteries except that the aforementioned positive electrode material is used as a positive electrode active material. The positive electrode 14 includes the positive electrode mixture layer 141 formed by applying a positive electrode mixture obtained by mixing a positive electrode active material, a conductive material and a binder on the positive electrode collector 140.

The conductive material ensures the electric conductivity of the positive electrode 14. Non-limiting examples of the conductive material that can be used include microparticles of graphite, carbon black such as acetylene black, Ketjen black, or carbon nanofiber, and microparticles of amorphous carbon such as needle coke.

The binder binds positive electrode active material particles, and a conductive material. Non-limiting examples of the binder that can be used include PVDF, EPDM, SBR, NBR, and fluorine rubber.

The positive electrode mixture is dispersed in a solvent and applied on the positive electrode collector 140. As the solvent, an organic solvent that dissolves the binder is usually used. Non-limiting examples of the solvent include NMP, dimethylformamide, dimethylacetamide, methyl ethyl ketone, cyclohexanone, methyl acetate, methyl acrylate, diethyltriamine, N—N-dimethylaminopropylamine, ethylene oxide, and tetrahydrofuran. In addition, there is a case that a dispersant or a thickener is added to water, and the positive electrode active material is made to be a slurry with PTFE or the like.

As the positive electrode collector 140, for example, a metal work of aluminum, stainless or the like, for example, foil, net, punched metal, foamed metal and the like that are worked into a plate-like shape can be used without limitation.

(Nonaqueous-Electrolyte)

As the nonaqueous-electrolyte 13, a supporting electrolyte dissolved in an organic solvent is used. As the supporting electrolyte of the nonaqueous-electrolyte 13, the kind thereof is not particularly limited, however, it is desired to be at least one of inorganic salts selected from $LiPF_6$, $LiBF_4$, $LiClO_4$ and $LiAsF_6$, derivatives of these inorganic salts, organic salts selected from $LiSO_3CF_3$, $LiC(SO_3CF_3)_3$ and $LiN(SO_2CF_3)_2$, $LiN(SO_2C_2F_5)_2$, $LiN(SO_2CF_3)(SO_2C_4F_9)$, and derivatives of these organic salts. These supporting electrolytes can make the battery performance more excellent, and can keep the battery performance further high in other temperature ranges than the room temperature. The concentration of the supporting electrolyte is not particularly limited, and is preferably selected appropriately in consideration of the kinds of the supporting electrolyte and the organic solvent depending on the intended use.

The organic solvent (nonaqueous solvent) that dissolves the supporting electrolyte is not particularly limited as long as it is an organic solvent that is usually used for a nonaqueous-electrolyte, and for example, carbonates, halogenated hydrocarbon, ethers, ketones, nitriles, lactones, oxolane compounds and the like can be used. In particular, propylene carbonate, ethylene carbonate, 1,2-dimethoxyethane, dimethyl carbonate, diethyl carbonate, ethylmethyl carbonate, vinylene carbonate and the like and mixed solvents thereof are appropriate. Among these exemplified organic solvents, using at least one kind of nonaqueous solvent selected from the group consisting of carbonates and ethers is preferred because the dissolubility of the supporting electrolyte, the dielectric constant and the viscosity are excellent and the charging and discharging efficiency of the battery is high. In the lithium ion secondary battery 1 of the present embodiment, the most preferred nonaqueous-electrolyte 13 is a supporting electrolyte dissolved in an organic solvent.

(Negative Electrode)

The negative electrode 17 includes the negative electrode mixture layer 171 formed by applying a negative electrode mixture obtained by mixing a negative electrode active material and a binder to the surface of the negative electrode collector 170.

As the negative electrode active material, conventional negative electrode active materials can be used. Negative electrode active materials containing at least one element selected from Sn, Si, Sb, Ge, and C can be recited. Among these negative electrode active materials, C is preferably a carbon material capable of occluding and eliminating electrolyte ions of the lithium ion secondary battery 1 (having Li occluding ability), and is more preferably amorphous coat natural graphite. Among these negative electrode active materials, Sn, Sb, and Ge are materials of alloy showing particularly large volume change. These negative electrode active materials may form alloys with other metal, such as Ti—Si, Ag—Sn, Sn—Sb, Ag—Ge, Cu—Sn, and Ni—Sn.

As the conductive material, carbon materials, metal powder, conductive polymer and the like can be used. From the view point of conductivity and stability, it is preferred to use carbon materials such as acetylene black, Ketjen black, and carbon black.

Examples of the binder include polytetrafluoroethylene (PTFE), poly(vinylidene fluoride) (PVDF), fluorine resin copolymer (tetrafluoroethylene-hexafluoropropylene copolymer) SBR, acrylic rubber, fluoric rubber, polyvinyl alcohol (PVA), styrene-maleic acid resin, polyacrylate, and carboxymethyl cellulose (CMC).

Examples of the solvent include organic solvents such as N-methyl-2-pyrrolidone (NMP) and water. As the negative electrode collector 170, a conventional collector can be used, and a metal work of copper, stainless, titanium, nickel or the like, for example, foil, net, punched metal, foamed metal and the like that are worked into a plate-like shape can be used without limitation.

(Other Configuration)

The positive electrode casing 11 and the negative electrode casing 16 seal the contents via the insulating sealing material 12. The contents include the nonaqueous-electrolyte 13, the positive electrode 14, the separator 15, the negative electrode 17, and the retaining member 18.

The positive electrode casing 11 is in surface contact with the positive electrode mixture layer 141 via the positive electrode collector 140 to conduct electricity. The negative electrode casing 16 is in surface contact with the negative electrode mixture layer 171 via the negative electrode collector 170.

The separator 15 interposed between the positive electrode mixture layer 141 and the negative electrode mixture layer 171 electrically insulates between the positive electrode mixture layer 141 and the negative electrode mixture layer 171, and retains the nonaqueous-electrolyte 13. As the separator 15, for example, a porous synthetic resin film, particularly, a porous film of polyolefinic polymer (polyethylene, polypropylene) is used. The separator 15 is formed to have a larger dimension than the mixture layers 141, 171 so as to ensure the electric insulation between the two mixture layers 141, 171.

The retaining member 18 has the function of retaining the positive electrode collector 140, the positive electrode mixture layer 141, the separator 15, the negative electrode mixture layer 171, and the negative electrode collector 170 at fixed positions. Use of an elastic member such as an elastic piece or spring facilitates the retention at fixed positions.

OTHER EMBODIMENT

While the lithium ion secondary battery 1 of the present embodiment has a coin-shaped form as described above, the form is not particularly limited, and it may be batteries having various shapes including a cylinder and a rectangle, and amorphous batteries enclosed in a laminate outer package.

The method for producing the positive electrode material of the present embodiment is not limited as long as the positive electrode material of the present embodiment has the aforementioned configuration. For example, a solid phase synthetic method, a co-precipitation synthetic method, a hydrothermal synthetic method, a complex polymerization synthetic method, a method mediated by ion exchange, a synthetic method by a high temperature and high pressure treatment, a sol-gel method, a spray dry method, a supercritical synthetic method and so on are recited, and these methods may be conducted solely or in combination of a plurality of methods.

EXAMPLES

Hereinafter, the present disclosure will be described by way of Examples. As Examples for specifically describing the present disclosure, a positive electrode material (positive electrode active material), a positive electrode and a lithium ion secondary battery employing the same were produced. In Examples, the lithium ion secondary battery shown in FIG. 1 was produced.

Example 1

Figure 2:
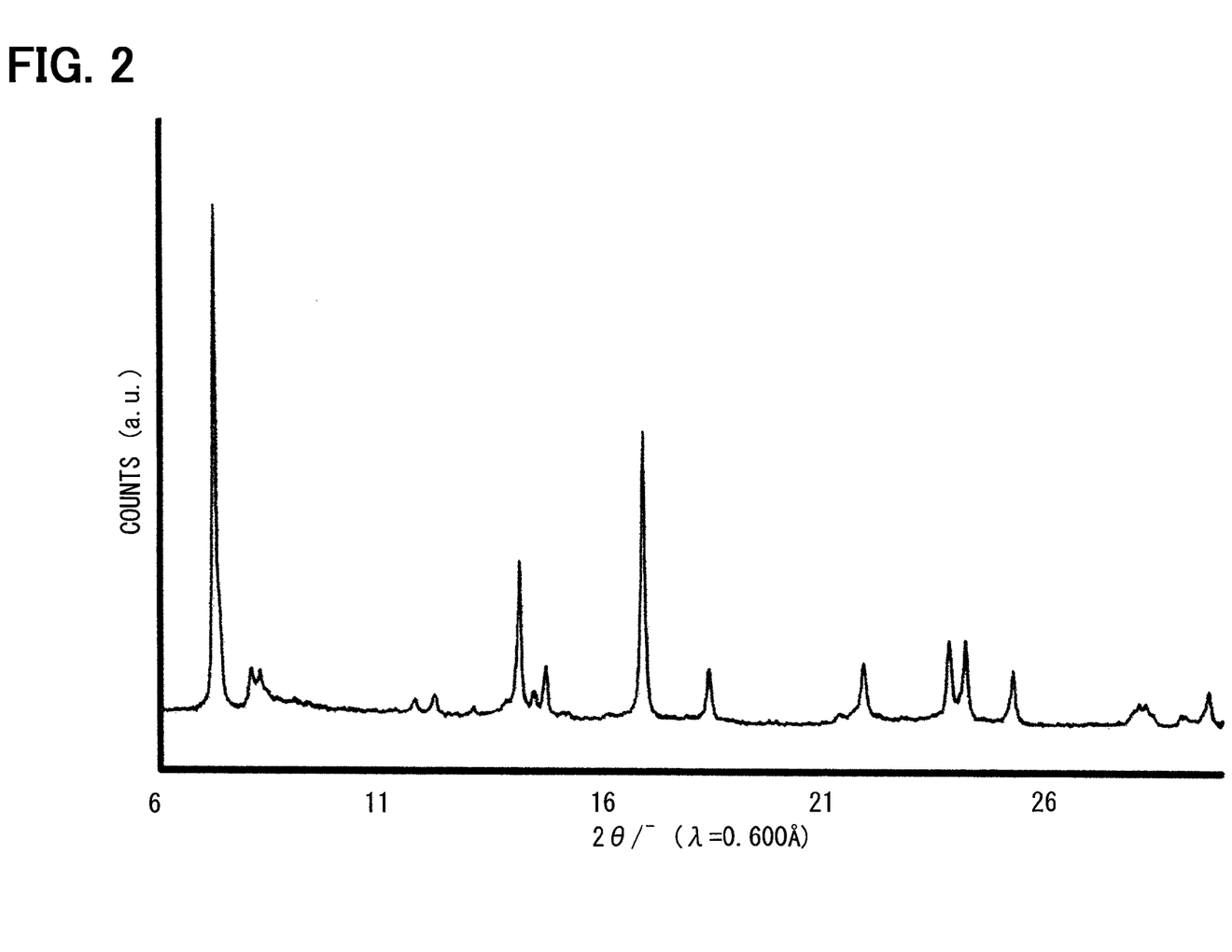
FIG. 2 is a graph showing the result of the powder XRD analysis of the positive electrode material in Example 1.

As a positive electrode material of the present example, a positive electrode material showing the following analysis result was prepared. An ICP emission analysis and a powder XRD analysis were conducted. The result of the powder XRD analysis is shown in FIG. 2. As a result, it was confirmed that the positive electrode material of the present example is a compound having a composition of $Li_2NiGeO_4$, and having a layered rock salt-type crystal structure, that can be indexed in a space group R3m (or C2/m). In addition, the powder XRD revealed that the positive electrode material of the present example is a substantially single phase.

(EXAFS)

For the obtained positive electrode material, an analysis by EXAFS was conducted in the following manner.

(1) Appropriate amounts of the positive electrode material of the present example and boron nitride were mixed, and compression-molded to form pellets.

(2) X-ray absorption measurement in the range of 8032 to 9040 eV was conducted by a transmission method.

(3) The data of the measurement result is opened in analytical software (Athena (Ver.0.9.013)) by using a plug-in for directly reading the energy/X-ray absorbed amount. Then removal of background and determination of EU are conducted by default algorisms. Regarding a pre-edge, the range of −150 to −30 eV from E0 was applied, and normalization was conducted by using the range of 150 to 980 eV from E0.

(4) In the range of 3≤k≤12, Fourier transformation is conducted by applying a Hanning window as a window function, and a radial distribution function which is one-dimensional distance information from the Ni center is acquired. At this point of time, adjustment of the phase was not conducted.

(5) The data after completion of Fourier transformation is read into analytical software (Artemis (Ver.0.8.012)).

(6) As a fitting condition, k-weight is set at 3 taking a peak corresponding to a primary coordination sphere as an object of fitting.

(7) In deriving a theoretical EXAFS function taking a phase shift and a back scattering factor into account, software (Atoms) that is added in the analytical software (Artemis) was used, and calculation was conducted for a model having a cluster size of 6 Å taking Ni situated at a Ni/Mn (3b) site of the layered rock salt-type crystal structure $Li_2NiMnO_4$ (CifNo0000000) as Core.

(8) Among the obtained paths, a path of Ni—O corresponding to a primary coordination sphere is selected. Then for the selected path, fitting was conducted at initial settings: amp: 0.1 (guess), coordination number N=6, enot: 0.01 (guess), delr: 0.01 (guess), ss: 0.01 (guess).

(9) The obtained R factor was 0.00009. Based on this R factor, it was determined that analysis was conducted with high accuracy. Further, ss was 0.0081 Å2, enot was 4.41 eV, and amp was 0.88, and these are numerical values having high analytical result validity. The Ni—O distance (corresponding to "average distance to the peak position corresponding to the primary proximity from the Ni center") was 2.06 Å. Based on this value, it can be determined that Ni has a six-coordination structure in consideration of the correspondence with the ionic radius table.

(10) Similarly, analysis regarding Ge was conducted. As a result, the Ge—O distance (corresponding to "average distance to the peak position Corresponding to the primary proximity from the Ge center") was calculated as 1.90 Å. Based on this value, it was determined that Ge is in a six-coordination state in consideration of the correspondence with the ionic radius table.

Figure 4:
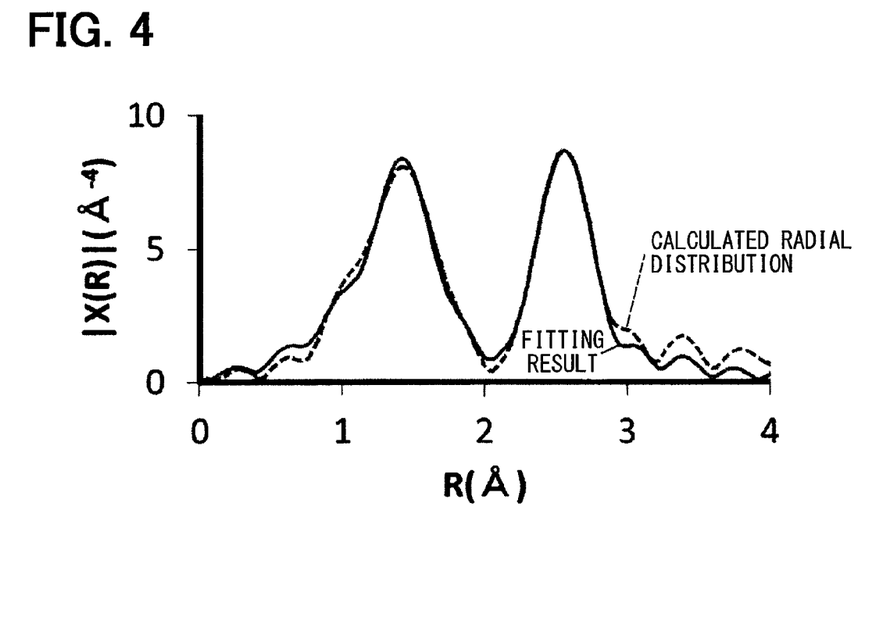
FIG. 4 is a graph showing the result of the EXAFS analysis of the positive electrode material in Example 1.

As an example of the result of EXAFS analysis, the result of EXAFS analysis for Ge is shown in FIG. 4.

Example 2

Figure 3:
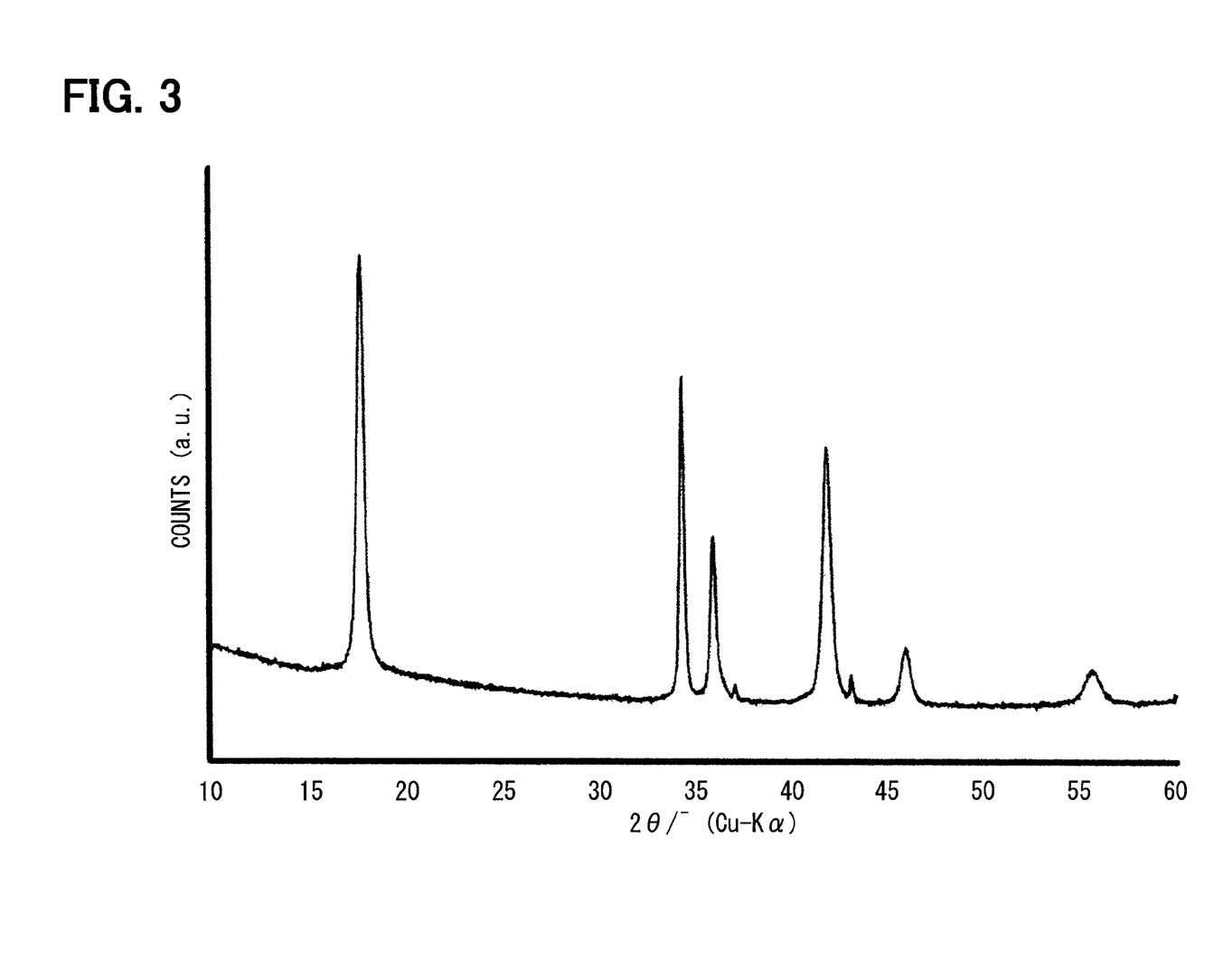
FIG. 3 is a graph showing the result of the powder XRD analysis of the positive electrode material in Example 2.

As a positive electrode material of the present example, a positive electrode material showing the following analysis result was prepared. In the same manner as in Example 1, an ICP emission analysis and a powder XRD analysis were conducted. The result of the powder XRD analysis is shown in FIG. 3. As a result, it was confirmed that the positive electrode material of the present example is a compound having a composition of $Li_2NiSnO_4$, and having a layered rock salt-type crystal structure, that can be indexed in a space group R3m (or C2/m). The powder XRD revealed that the positive electrode material of the present example is a substantially single phase.

(EXAFS)

In the same manner as in Example 1, analysis was conducted by EXAFS. Also in this Example, similarly to the case of Example 1, it can be determined that Ni and Sn have a six-coordination structure in consideration of the correspondence with the ionic radius table.

Example 3

As a positive electrode material of the present example, a positive electrode material showing the following analysis result was prepared. In the same manner as in Example 1, an ICP emission analysis and a powder XRD analysis were conducted. As a result, it was confirmed that the positive electrode material of the present example is a compound having a composition of $Li_2NiMn_{0.1}Sn_{0.9}O_4$, and having a layered rock salt-type crystal structure, that can be indexed in a space group R3m (or C2/m). The powder XRD revealed that the positive electrode material of the present example is a substantially single phase.

(EXAFS)

In the same manner as in Example 1, analysis was conducted by EXAFS. Based on the result, it can be determined that Ni and Sn have a six-coordination structure in consideration of the correspondence with the ionic radius table similarly to the case of Example 1.

Example 4

As a positive electrode material of the present example, a positive electrode material showing the following analysis result was prepared. In the same manner as in Example 1, an ICP emission analysis and a powder XRD analysis were conducted. As a result, it was confirmed that the positive electrode material of the present example is a compound having a composition of $Li_2NiMn_{0.1}Ge_{0.9}O_4$, and having a layered rock salt-type crystal structure, that can be indexed in a space group R3m (or C2/m). The powder XRD revealed that the positive electrode material of the present example is a substantially single phase.

(EXAFS)

In the same manner as in Example 1, analysis was conducted by EXAFS. Based on the result, it can be determined that Ni and Ge have a six-coordination structure in consideration of the correspondence with the ionic radius table similarly to the case of Example 1.

Comparative Example 1

$Li_2CO_3$, $Co(COO)_2$, and $GeO_2$ in a stoichiometric composition were wet blended in a ball mill by using ethanol. Then, the obtained powder was fired in an Ar atmosphere at 350° C. for 9 hours, and at 1000° C. for 12 hours. As a result, $Li_2CoGeO_4$ was obtained as blue powder.

Comparative Example 2

Aqueous solutions respectively containing metal complexes of Li and Ni were prepared. The obtained complex solutions were mixed so that the composition ratio of the intended positive electrode material was achieved. After drying the obtained mixed solution in an oven, and removing organic components by a heating treatment, heating and firing were conducted. In this manner, the positive electrode material of the present example ($Li_{1.05}NiO_2$ powder) was produced.

[Evaluation]

As evaluation of the positive electrode material of each of the aforementioned examples, a lithium ion secondary battery was assembled, and charging and discharging characteristics were evaluated. After measurement of the charging and discharging characteristics, the coin-shaped battery was disassembled, and the positive electrode was taken out and subjected to evaluation of safety.

(Lithium Ion Secondary Battery)

Using the positive electrode active material of each of the aforementioned examples, a test cell formed of a lithium ion secondary battery (2032-type coin-shaped half cell) was assembled and evaluated.

(Coin-Shaped Half Cell)

A test cell (coin-shaped half cell) has the same configuration as the coin-shaped lithium ion secondary battery 1 having the configuration shown in FIG. 1.

As the positive electrode, the one in which the positive electrode mixture layer 141 was formed by applying a positive electrode mixture obtained by mixing 91 parts by mass of a positive electrode active material (positive electrode active material of each example), 2 parts by mass of acetylene black, and 7 parts by mass of PVDF, on the positive electrode collector 140 formed of aluminum foil was used. As the negative electrode (counter electrode), metal lithium was used. This corresponds to the negative electrode mixture layer 171 in FIG. 1.

As the nonaqueous-electrolyte 13, a solution prepared by dissolving $LiPF_6$ in 1 mol/litter in a mixed solvent of 30 vol. % of ethylene carbonate (EC) and 70 vol. % of diethyl carbonate (DEC) was used. After being assembled, a test cell was subjected to an activation treatment by charging and discharging of $\frac{1}{3}$ C×2 cycles. In the manner as described above, a test cell of each example (half cell) was produced.

[Charging and Discharging Characteristics]

For a lithium ion secondary battery, charging and discharging were conducted at a $\frac{1}{50}$ C rate. Charging was conducted by CC charging with a cutoff voltage of 4.5 V, and discharging was conducted by CC discharging with a cutoff voltage of 2.6 V. The measurement results of the initial charging capacity and the initial discharge capacity of the lithium ion secondary battery of each example (Examples 1 to 4, Comparative examples 1 to 2) are shown in Table 1.

Figure 5:
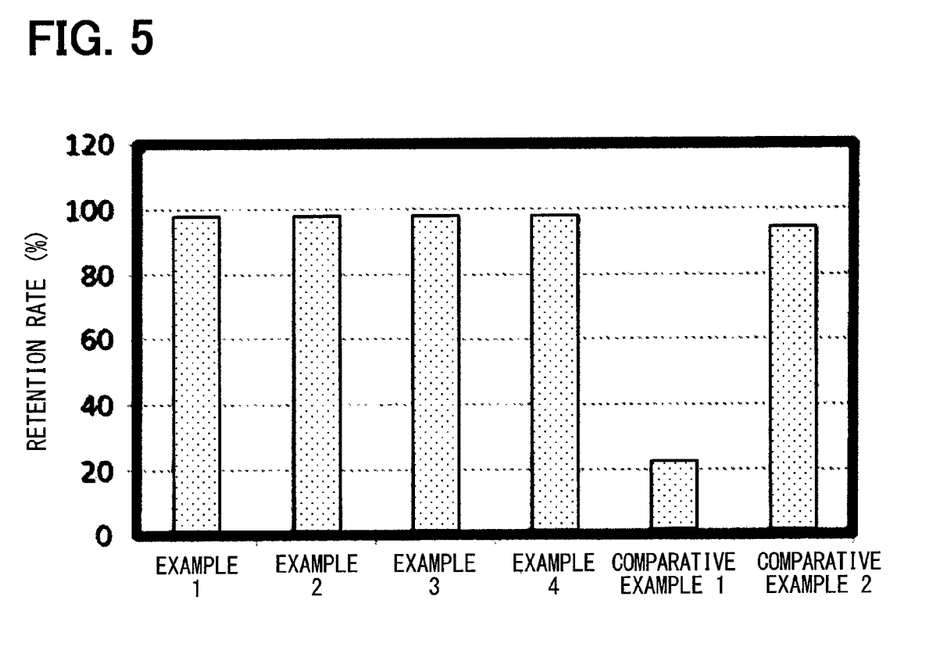
FIG. 5 is a graph showing the variation in discharge capacity of the secondary battery in Examples and Comparative examples.

Similar charging and discharging were repeated 10 cycles, and the retention rate of the discharge capacity of each lithium ion secondary battery is shown in FIG. 5. A retention rate in FIG. 5 indicates a discharge capacity at the tenth cycle by a percentage to an initial discharge capacity as 100% so as to indicate the reduction rate of the discharge characteristic.

TABLE 1

| | Positive electrode material | | | Battery evaluation | | |
|---|---|---|---|---|---|---|
| | | | | Initial charging capacity | Initial discharge capacity | Oxygen amount |
| | Chemical formula | Crystal structure | Coordination structure | (mAh/g) | (mAh/g) | (mass %) |
| Example 1 | $Li_2NiGeO_4$ | Layered rocksalt-type structure | Ni—O six-coordination structure | 152 | 141 | 0.58 |
| Example 2 | $Li_2NiSnO_4$ | Layered rocksalt-type structure | Ni—O six-coordination structure | 140 | 126 | 0.94 |
| Example 3 | $Li_2NiMn0.1Ge0.9O_4$ | Layered rocksalt-type structure | Ni—O six-coordination structure | 156 | 144 | 0.62 |

TABLE 1-continued

| | Positive electrode material | | | Battery evaluation | | |
| --- | --- | --- | --- | --- | --- | --- |
| | | | | Initial charging capacity | Initial discharge capacity | Oxygen amount |
| | Chemical formula | Crystal structure | Coordination structure | (mAh/g) | (mAh/g) | (mass %) |
| Example 4 | $Li_2NiMn_{0.1}Sn_{0.9}O_4$ | Layered rocksalt-type structure | Ni—O six-coordination structure | 142 | 131 | 0.91 |
| Comparative example 1 | $Li_2CoGeO_4$ | — | Co—O four-coordination structure | 25 | 7 | 0.92 |
| Comparative example 2 | $Li_{1.05}NiO_2$ | Layered rocksalt-type structure | Ni—O six-coordination structure | 170 | 155 | 8.94 |

As shown in Table 1, a secondary battery of each Example showed much better charge capacity and discharge capacity in comparison with Comparative example 1.

Also as shown in FIG. 5, the secondary batteries of every Example showed high retention rate of discharge capacity of substantially 100%, and showed very small reduction in discharge capacity. In contrast to this, in the secondary battery of Comparative example 1, it can be confirmed that the retention rate of the discharge capacity largely decreases as a result of repeated charging and discharging.

[Safety Test]

For a lithium ion secondary battery, charging was conducted by CC charging at a ⅕₀ C rate up to 4.8 V. After end of the charging, the battery was disassembled and the positive electrode was taken out. The taken out positive electrode was washed with DMC, and then heated from the room temperature to 1000° C. at a temperature rising speed of 20° C./min in a helium atmosphere. At this time, the amount of oxygen generated from the positive electrode was measured by TPD-MS measurement.

The measurement result is also shown in Table 1. The measurement result is shown by a ratio of the mass of oxygen to the mass of the positive electrode as 100%. After the positive electrode was allowed to cool in an atmospheric air after measurement of the oxygen amount, the mass of positive electrode was measured. As shown in Table 1, the positive electrode of each Example generated much less amount of oxygen in comparison with Comparative example 2, and thus was excellent.

As described above, it was confirmed that the positive electrode (lithium ion secondary battery 1) of each Example had excellent battery characteristics and safety.

The invention claimed is:

1. A positive electrode material comprising:
$Li_2Ni_\alpha M^1_\eta M^2_\beta O_{4-\gamma}$, wherein
$0<(\alpha+\eta)\leq 2$;
$0\leq\eta<0.5$;
$0<\beta\leq 2$;
$0\leq\gamma\leq 1$;
$1\leq(\alpha+\eta+\beta)\leq 2.1$;
$0.8<\beta/(\alpha+\eta)$;
$M^1$ is Mn;
$M^2$ is at least one selected from Ge and Sn; and
Ni and $M^1$ has a local structure of six-coordination.

2. The positive electrode material according to claim 1, wherein: $M^2$ has a local structure of six-coordination.

3. The positive electrode material according to claim 1, comprising:
at least one of $Li_2NiGeO_4$ and $Li_2NiSnO_4$.

4. The positive electrode material according to claim 1, wherein:
in an analysis result of a radial distribution function obtained by Fourier transformation in a region of $3<k\leq 12$ corresponding to an EXAFS region for a X-ray absorption measurement result of K-edge of Ni, an average distance between a peak position corresponding to a primary proximity and a Ni center is in a range between 2.00 Angstrom and 2.20 Angstrom.

5. The positive electrode material according to claim 1, wherein:
in an analysis result of a radial distribution function obtained by Fourier transformation in a region of $3<k\leq 12$ corresponding to an EXAFS region for a X-ray absorption measurement result of K-edge of Ge or Sn, an average distance between a peak position corresponding to a primary proximity and a Ge or Sn center is described by six-coordination.

6. A positive electrode for nonaqueous-electrolyte secondary battery formed by using a positive electrode material, wherein:
the positive electrode material comprises:
$Li_2Ni_\alpha M^1_\eta M^2_\beta O_{4-\gamma}$,
$0<(\alpha+\eta)\leq 2$;
$0\leq\eta<0.5$;
$0<\beta\leq 2$;
$0\leq\gamma\leq 1$;
$1\leq(\alpha+\eta+\beta)\leq 2.1$;
$0.8<\beta/(\alpha+\eta)$;
$M^1$ is Mn;
$M^2$ is at least one selected from Ge and Sn; and
Ni and $M^1$ has a local structure of six-coordination.

7. A nonaqueous-electrolyte secondary battery formed by using a positive electrode for nonaqueous-electrolyte secondary battery, wherein:
the positive electrode for nonaqueous-electrolyte secondary battery is formed by using a positive electrode material;
the positive electrode material comprises:
$Li_2Ni_\alpha M^1_\eta M^2_\beta O_{4-\gamma}$,
$0<(\alpha+\eta)\leq 2$;
$0\leq\eta<0.5$;
$0<\beta\leq 2$;
$0\leq\gamma\leq 1$;
$1\leq(\alpha+\eta+\beta)\leq 2.1$;
$0.8<\beta/(\alpha+\eta)$;
$M^1$ is Mn;
$M^2$ is at least one selected from Ge and Sn; and
Ni and $M^1$ has a local structure of six-coordination.

* * * * *